United States Patent

Abe

[11] Patent Number: 6,025,743
[45] Date of Patent: Feb. 15, 2000

[54] PLL CIRCUIT HAVING FORCIBLE PULL-IN FUNCTION

[75] Inventor: Yoshinori Abe, Tokyo, Japan

[73] Assignee: Pioneer Electronic Corporation, Tokyo, Japan

[21] Appl. No.: 08/869,010

[22] Filed: Jun. 4, 1997

[30] Foreign Application Priority Data

Jun. 4, 1996 [JP] Japan ................................ 8-141514

[51] Int. Cl.[7] ................................................... H03L 7/06
[52] U.S. Cl. ........................ 327/159; 327/7; 327/150; 331/17; 331/14; 331/DIG. 2; 375/376
[58] Field of Search .................... 327/12, 156, 7, 327/159, 150; 331/25, 17, 14, 18, DIG. 2; 375/373, 374, 376

[56] References Cited

U.S. PATENT DOCUMENTS

| | | | |
|---|---|---|---|
| 3,873,929 | 3/1975 | Willmore | 327/156 |
| 4,847,569 | 7/1989 | Dudziak et al. | 331/25 |
| 4,885,554 | 12/1989 | Wimmer | 331/25 |
| 5,307,020 | 4/1994 | Marcuard | 327/7 |
| 5,363,419 | 11/1994 | Ho | 375/376 |

*Primary Examiner*—Kenneth B. Wells
*Assistant Examiner*—Minh Nguyen
*Attorney, Agent, or Firm*—Fish & Richardson, PC

[57] ABSTRACT

A phase locked loop (PLL) circuit performs a frequency pull-in operation with a simple structure. The PLL circuit has an oscillating part which oscillates at a frequency corresponding to a control input signal and a phase comparing part which detects a phase difference between an oscillation output signal of said oscillator and an input frequency signal and produces an error signal responsive to a detection value. The PLL circuit further includes a forcible pull-in part which adds values of the error signal and a forcible pull-in signal, and provides a signal based on a result of addition as the control input signal. The forcible pull-in circuit includes a reference value generating circuit which supplies a reference value determining a unit change width of an oscillation signal of the oscillating part, and a computing part which computes a value of the forcible pull-in signal based on the reference value.

23 Claims, 9 Drawing Sheets

FIG.6

| NUMBER OF ATTEMPTS n | 1 | 2 | 3 | 4 | 5 | 6 | 7 | ... | $n_{MAX}-3$ | $n_{MAX}-2$ | $n_{MAX}-1$ | $n_{MAX}$ |
|---|---|---|---|---|---|---|---|---|---|---|---|---|
| SET REFERENCE VALUE (v) | | 0.0005 | -0.0005 | 0.0005 | -0.0005 | 0.0005 | -0.0005 | | 0.0005 | -0.0005 | 0.0005 | -0.0005 |
| NUMBER OF INTEGRATIONS (N) | 0 | 1 | 1 | 2 | 2 | 3 | 3 | | $\frac{n_{MAX}-3}{2}$ | $\frac{n_{MAX}-3}{2}$ | $\frac{n_{MAX}-1}{2}$ | $\frac{n_{MAX}-1}{2}$ |
| OUTPUT INTEGRATION VALUE (r + vN) | 0.25 | 0.25 +0.0005 | 0.25 -0.0005 | 0.25 +0.001 | 0.25 -0.001 | 0.25 +0.0015 | 0.25 -0.0015 | | $0.25+0.0005 \times \frac{n_{MAX}-3}{2}$ | $0.25-0.0005 \times \frac{n_{MAX}-3}{2}$ | $0.25+0.0005 \times \frac{n_{MAX}-1}{2}$ | $0.25-0.0005 \times \frac{n_{MAX}-1}{2}$ |

NOTE: $n_{MAX}$ IS ODD
r : RESET VALUE

PLL CIRCUIT HAVING FORCIBLE PULL-IN FUNCTION

BACKGROUND OF THE INVENTION

1. Field of the Invention

The present invention relates to a phase locked loop (PLL) circuit and a frequency pull-in method therefor.

2. Description of Related Art

FIG. 1 shows a basic structure of a PLL circuit used commonly.

In FIG. 1, a phase comparator 92 performs a phase comparison between a reference frequency signal from a quartz oscillator 91 and an output signal of the PLL circuit, and a phase error signal representing the phase error between those signals is supplied to a low-pass filter (LPF) 93 so that a low frequency component of the phase error signal is supplied to a voltage controlled oscillator (VCO) 94. The VCO 94 oscillates at a frequency responsive to the supplied low-frequency component of the phase error signal. The output signal of the VCO is used as the output signal of the PLL circuit and also supplied to the phase comparator 92. With the structure described above, the PLL circuit produces the output signal which is synchronized in phase with the reference frequency signal.

However, as shown in FIG. 2, the pull-in (lock-in) to the reference frequency $f_0$ may not be performed surely if the difference between the reference frequency $f_0$ of the quartz oscillator 91 and the oscillation frequency of the VCO 94 is large at an initial stage of the operation of the PLL circuit. To cope with this problem, it is conceivable to set an input voltage of the VCO 94 to a voltage by which the oscillation frequency of the VCO is forcibly controlled to an oscillation frequency $f_{VCO}$, near to the reference frequency $f_0$ until the PLL circuit locks.

More particularly, as shown in FIG. 3, it is conceivable to provide an adder 95 and a voltage outputting circuit 96, thereby to add a voltage to forcibly pull-in the PLL circuit to the input voltage of the VCO 94. However, if the frequency error between the reference frequency and the oscillation frequency of the VCO is not detected, it is not possible to derive the voltage value for the forcible pull-in operation suited for the frequency error value. Therefore in the scheme depicted in FIG. 3, a number of voltage values for the forcible pull-in of the PLL circuit are stored in a bank memory 96a, in the voltage outputting circuit 96. One of the voltage values stored in the bank memory 96a is in turn selected by means of a selector 96b, so that the voltage of the selected value is supplied to the adder 95, to perform an attempt of the pull-in to the reference frequency $f_0$. For assuring the usability of the PLL circuit for various reference oscillators, it is required that the bank memory 96a is writable from outside, and has a capacity sufficient for storing numerous voltage values.

As explained above, the frequency pull-in scheme shown in FIG. 3 has a drawback that the complexity of the structure and the scale of the circuit will inevitably be increased when it is sought to broaden the width of the use of the circuit.

OBJECT AND SUMMARY OF THE INVENTION

The present invention has been made to solve the problem described above, and an object of the present invention is to provide a PLL circuit which performs the pull-in of frequency with a simple structure and the range of its use can be widened.

A PLL circuit according to the present invention comprises: an oscillator which oscillates at a frequency corresponding to a control input signal; a phase comparator which detects a phase difference between an oscillation output signal of the oscillator and an input frequency signal and produces an error signal responsive to a detection value; and a forcible pull-in circuit which adds values of the error signal and a forcible pull-in signal, and provides a signal based on a result of addition as the control input signal, wherein the forcible pull-in circuit includes a reference value generator which supplies a reference value determining a unit change width of an oscillation signal of the oscillator, and a computing circuit which computes a value of the forcible pull-in signal based on the reference value.

BRIEF EXPLANATION OF THE DRAWINGS

FIG. 6 is a diagram showing the relationship among the number of attempts, set reference values, number of integration operations, and integration output values which are set by the frequency pull-in operation performed by the control part in the PLL circuit shown in FIG. 4;

DETAILED DESCRIPTION OF THE PREFERRED EMBODIMENT

Figure 4:
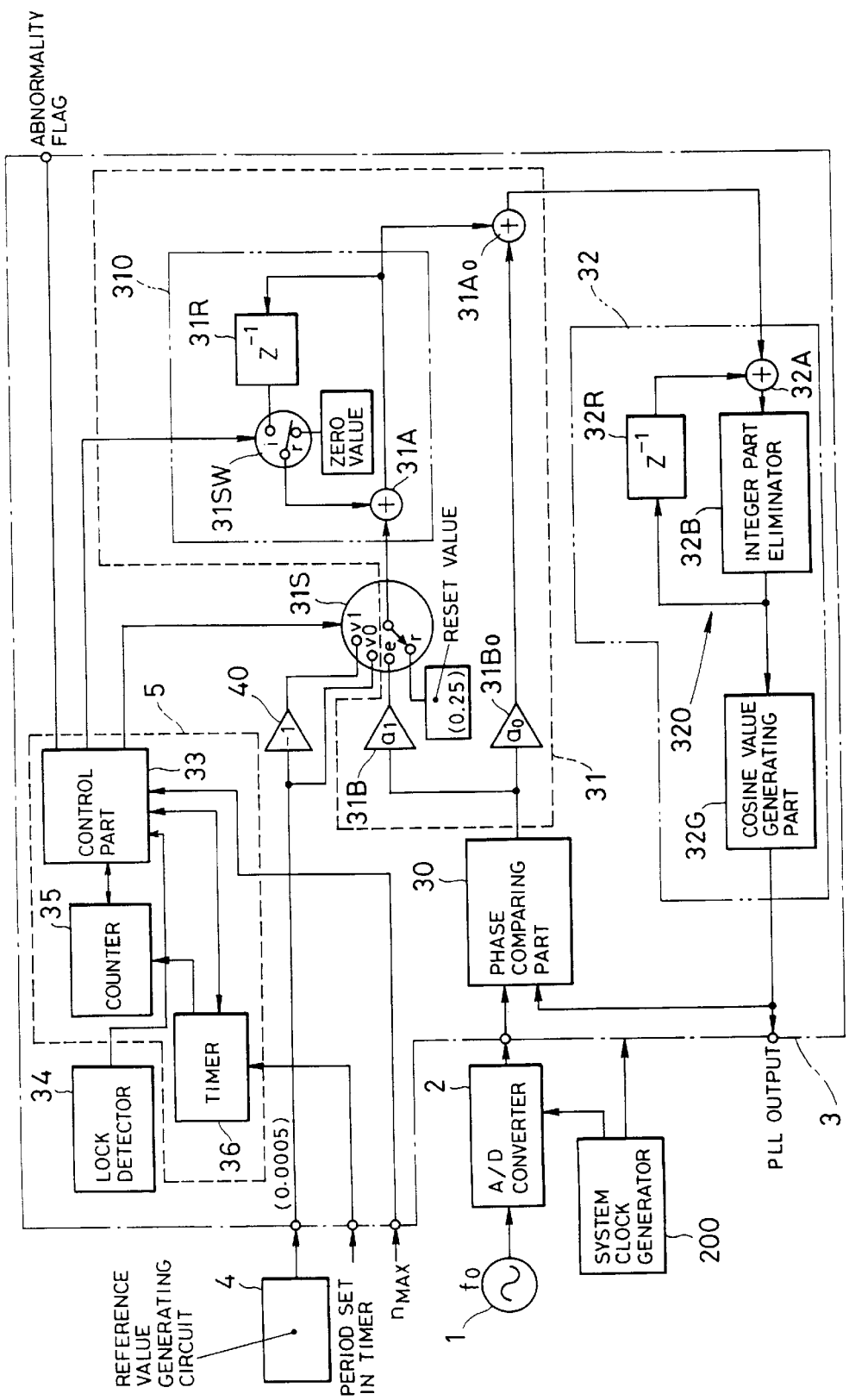
FIG. 4 is a diagram showing an embodiment of the PLL circuit according to the present invention.

FIG. 4 is a block diagram showing the structure of an example of the PLL circuit in which the frequency control method according to the present invention is applied.

As shown in FIG. 4, a reference oscillator 1 supplies a reference frequency, that serves as a target frequency e.g., a sinusoidal signal having a frequency of 5 MHz±100 kHz (hereinafter, referred to as reference signal) to an A/D converter 2. A system clock generator 200 generates a rectangular system clock oscillating at a frequency of 20 MHz, for example, and supplies it to the A/D converter 2, and a PLL circuit 3. In synchronism with the system clock, the A/D converter 2 performs the sampling and quantization of the supplied reference signal so as to convert it into a digital value sequence, and supplies a thus produced digitized reference signal to the PLL circuit 3.

The PLL circuit 3 performs a processing of the digital signal in synchronism with the system clock. As basic structural elements, the PLL circuit 3 includes a loop constituted by a digital phase comparing part 30 which receives the digitized reference signal as an input signal, a digital-loop filter (D-LPF) 31 which receives a comparison output signal of the comparing part 30, and a variable frequency generating part 32 which produces a sampled-cosine wave sequence in digital form, and supplies it to the other input terminal of the phase comparing part 30 and an external output terminal of the PLL circuit 3.

The variable frequency generating part 32 includes a phase-angle operator (or a digital VCO) which is constituted by an accumulator register 32R, an adder 32A which adds an output value of the register 32R to an output value of the D-LPF 31, and an integer part eliminator 32B which produces only a fractional part of a result of the addition. In synchronism with the system clock, the accumulator register 32R holds the output signal of the integer part eliminator 32B, and gives out the hold value to an input terminal of the adder 32A so that it is added to the output value of the D-LPF 31. With this structure, the phase angle operator 320 produces a sequence of values equal to or more than 0 and also less than 1 which increases or decreases in an inclination proportional to the output value of the D-LPF 31. The sequence of the output values of the phase angle operator 320 thus constitutes a sampled sawtooth wave signal whose frequency varies in proportion to the output value of the D-LPF 31. For instance, if the initial value of the accumulator register 32R is 0.0 and the D-LPF 31 has a constant output value of 0.25, then the output value sequence of the phase angle operator 320 assumes {0.0, 0.25, 0.5, 0.75, 0.0, . . .}. Since the frequency of the system clock for the processing of the digital signal in the PLL circuit 3 is 20 MHz, a sampled sequence of the saw-tooth wave having a frequency of 5 MHz is obtained. As will be understood from the above example, the output value sequence of the phase angle operator 320 is a saw-tooth wave sampled sequence which oscillates at a frequency determined by a multiplication of the output value of the D-LPF 31 to the frequency of the system clock, which is 20 MHz in the above-described case.

The variable frequency generating part 32 further includes a cosine generating part 32G in its output stage. Based on the output value series $X_k$ of the phase angle operator 320, the cosine value generating part 32G produces a digital value sequence expressed by $Y_k=\cos(2\pi X_k)$. The digital value sequence generated as described above constitutes the output signal of the variable frequency generating part 32.

When the selector 31S selects the second input signal e, the D-LPF 31 functions as a complete integration type filter whose transfer function in a continuous time system is represented by the equation of $H(s)=a+(b/s)$, where $s=j\omega$. The first term in the right side of the equation is a proportional term that corresponds to a signal path from a coefficient multiplier $31B_0$ which receives the comparison output value of the phase comparing part 30, to a digital adder $31A_0$ which receives the multiplication output signal of the coefficient multiplier $31B_0$. The portions of the circuit other than this signal path correspond to an integration term represented by the second term of the above equation. More concretely, the operation of the integration term is performed, accomplished by an integration part constituted by another coefficient multiplier $31B_1$ which receives the comparison output signal of the phase comparison part 30, the selector 31S which outputs a value selected from among the multiplication output value of this circuit and other values, and an integrator 310 which integrates the selected output value. Each one of the coefficient value multiplication parts is configured to multiply a predetermined coefficient $a_0$ or $a_1$ to the input value and to output a resultant value. The values of the coefficients are determined to attain a desired loop characteristic.

The selector 31S has first to fourth input terminals, among which a predetermined reset value (0.25 in this example) is supplied to the first input terminal r, and the output value of the coefficient multiplier $31B_1$ is supplied to the second input terminal e. A reference value (hopping step value) supplied from a reference value generating circuit 4 provided outside the PLL circuit 3 and a value obtained by inverting the reference value in polarity are supplied to the third and fourth input terminals v0 and v1, respectively.

As the reference value described above, 0.0005 is used in this example. However, this value is not limitative and the essential point is that this reference value should be a value which determines a unit change width of the oscillation frequency of the oscillation part 320. As a circuit for inverting the polarity of the reference value, a coefficient multiplier 40 is utilized.

The integrating part 310 is constituted by an adder $31A_1$ which receives the output value of the selector 31S as one of the input signals, an integration register 31R which holds the summing output value of the adder $31A_1$, and a switching part 31SW which supplies either the value held by the integration register 31R or a predetermined reset value (0 in this example) to the other input terminals of the adder $31A_1$. The output value of the adder $31A_1$ is also supplied to the other input terminal of the adder $31A_0$. The register 31R holds the summing output of the adder $31A_1$, and supplies it to the input terminal of the adder $31A_1$ so that the holding value is added to the output value of the selector 31S in an integration mode (a mode where the switching part 31SW provides the signal at its one input terminal i) other than a reset mode. With this structure, the integration part 310 produces, in the integration mode, a value obtained by accumulating the output value of the selector 31S. Therefore, the integration part 310 produces a result of integration of the output value of the selector 31S in the integration mode.

This result of integration is added to an adder $31A_0$. By this feature, the integrated value is added to a comparison output (phase error) passed through the coefficient multiplier $31B_0$, and a resultant signal is provided as a filter output signal.

If, on the other hand, a control operation is performed to assume a reset mode in which the switching part provides a signal at its other input terminal r, a zero value is derived at the adder $31A_1$. As a result, the value held at the register 31R is not added to the output value of the selector 31S at the adder $31A_1$. Therefore, the integration operation is not performed, and if a control is made to establish a reset mode in which the selector 31S also outputs the reset value (0.25) at its first input terminal, the register 31R is initialized so that its holding value is made equal to the reset value of 0.25.

The selector 31S, the switching part 31SW and the integration register 31R are operated by a control part 33 respectively according to control procedures which respectively are adapted to each of these element. More specifically, the control part 33 issues a selection control signal to instruct the selector 31S as to which one of the values at the first to fourth input terminals r, e, v0, V1 is to be selected and outputted, and issues a selection control signal to instruct the switching part 31SW as to which one of the values at the input terminals r, i is to be outputted. The control part 33 performs these control operations based on the operations of a lock detector 34, a counter 35, and a timer 36. The control part 33 and the selector 31S constitute a computing circuit, and the computing circuit constitutes a forcible interruption circuit together with a reference value generating circuit 4.

The lock detector 34 detects locked and non-locked states of the PLL circuit by using a known technique, and supplies a detection output signal to the control part 33. The counter 35 is provided to count the number of the attempt of a frequency pull-in operation (hopping) from an initial stage of the operation of the PLL circuit, and supplies a count value to the control part 33. The counting operation of the counter is performed in accordance with an output signal of the timer 36. Based on the information supplied from the control part 33, the timer 36 produces a waiting time period for the lock detection from a time of the start of the control by the working loop. When a predetermined time has elapsed from the start time, the timer 35 supplies an information indicating that fact to the counter 35, and the counter 35 increases the count values by one, and notifies the control part 33 of the updated count value.

As described above, the control part 33 performs the control of the switching part 31SW and the integration register 31R in cooperation with the lock detector 34, counter 35 and counter 35. It is, however, not necessary that the lock detector 34, counter 35 and counter 35 function respectively as an independent block. It is, therefore, possible to provide these circuit elements as a single block 5 indicated as an area enclosed by a dotted line in FIG. 4.

The frequency pull-in (frequency hopping) operation which is performed by the control part 33 in the PLL circuit 3 will now be explained with reference to the flowchart of FIG. 5.

Figure 5:
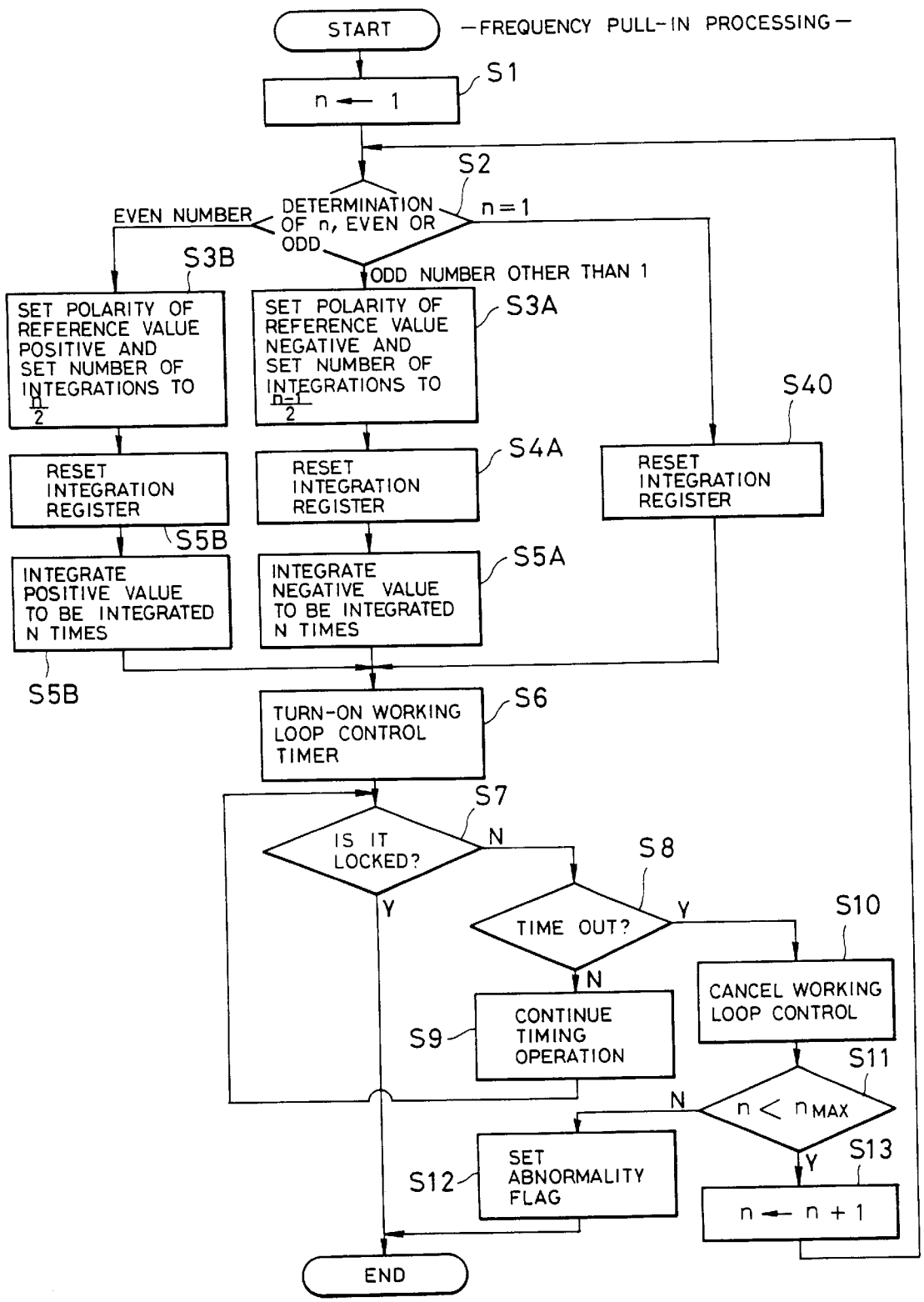
FIG. 5 is a flowchart showing a frequency pull-in procedure performed by a control part of the PLL circuit shown in FIG. 4.

In FIG. 5, the control part 33 sets the value n in the counter, which indicates a current number of attempts, to "1" at step S1. At step S2, the control part 33 judges as to whether the count value n is an odd number other than "1" or "1". If it is detected at step S2 that n is "1", then the control part 33 resets the integration part 310 (step S40). In this resetting operation, the control part 33 produces a control signal to instruct the selector 31S to provide the reset value (0.25) at its first input terminal r to the integrating part 310, for at least one cycle of the system clock. The control part 33 also produces a control signal to instruct the switching part 31SW to supply the zero value at the input terminal r to the adder $31A_1$ in the resetting operation. With these operations, the integration part 310 is reset, that is, the reset value (0.25) is held at the integration register 31R.

If the value n is detected to be an even number in step S2, the control part 33 sets the polarity of the reference value to positive, and sets the number N of integrations to n/2 (step S3B). The control part 33 then resets the integration part 310 (step S4B). The operation of this resetting is performed in the same manner as in the step S40.

After the completion of the resetting of the integration part 310, the control part 33 performs the integration of the positive reference value (positive value to be integrated=+ 0.0005) by the number of times of integration N which has been set in step 3B (step S5B). More concretely, during the period of consecutive n/2 system clocks, a selection control signal is supplied to the selector 31S to provide the positive reference value at the third input terminal $v_0$ to the integration part 310, and a switch control signal is supplied to the switching part 31SW to provide the value held by the register received at its other input terminal i, to the adder $31A_1$.

If n is any of the values 2, 4, 6, . . . , and $n_{MAX}-1$ (when it is assumed that $n_{MAX}$ is an odd number) in the flow of operations leading to step S5B, the above-described integration control operation is performed for 1, 2, 3, . . . or $(n_{MAX}-1)/2$ system clocks. The positive reference value is accumulated by the corresponding number of times. By this operation, the integration register 31R holds, as respective initial values, the values of:

0.25+0.0005,
0.25+0.0010,
0.25+0.0015, . . . , and
0.25+0.0005×$(n_{MAX}-1)/2$ which are shown in FIG. 6 as output integrated values for the even numbers of the attempts.

If the value n is detected to be an odd number in step S2, the control part 33 sets the polarity of the reference value to negative, and sets the number N of integration to (n−1)/2 (step S3A). The control part 33 then resets the integration part 310 as in the steps S4B and S40 (step S4A). This time, the control part 33 performs the integration of the negative reference value (negative value to be integrated=−0.0005) by the number of times of integration N which has been set in step 3A (step S5A). More specifically, during the period of consecutive (n−1)/2 system clocks, a selection control signal is supplied to the selector 31S to provide the negative reference value at the fourth input terminal v1 to the integration part 310, and a switch control signal is supplied to the switching part 31SW to provide the value held by the register received at its other input terminal i, to the adder $31A_1$.

If n is any of the values 3, 5, 7, . . . , and $n_{MAX}$ (when it is assumed that $n_{MAX}$ is an odd number) in the flow of operations leading to step S5A, the above-described integration control operation is performed for the period of 1, 2, 3, . . . or $(n_{MAX}-1)/2$ system clocks. The negative reference value is accumulated by the corresponding number of times. By this operation, the integration register 31R holds, as respective initial values, the values of:

0.25−0.0005,
0.25−0.0010,
0.25−0.0015, . . . , and
0.25−0.0005×$(n_{MAX}-1)/2$ which are shown in FIG. 6 as output integrated values for the odd numbers of the attempts other than 1.

After the initial integration values corresponding to the number of attempts indicated by n have been obtained, the steps after the step S6 are performed.

That is, the control part 33 drives the PLL circuit 3 in the loop operation working mode, and activates the timer 36 (step S6). In the working loop operation (PLL operation), the selector 31S is controlled to provide the value at its second input terminal e, and the switching part 31SW is controlled to provide the value held in the register, supplied at its input terminal i. By these operations, the integration part 310 starts the operation of integrating the output signal of the coefficient multiplier $31B_1$ beginning from the initial value generated at one of the steps S5A, S5B and S40. The digital VCO 320 is urged to oscillate in a stable manner by the control input value corresponding to the integration output value produced by the integration part 310. The timer 36 starts its timing operation from the beginning of the working loop operation.

In the state that the VCO is urged to perform a stable operation by the working loop as described above, the control part 33 monitors the locking state of the PLL based on an output signal of the lock detector 34 (step S7). If a lock-in of the PLL is detected, the frequency pull-in operation is completed so as to thereafter maintain the closing state of the working loop established at step S6. If, on the other hand, it is detected in step S7 that the PLL has not locked-in, the control part 33 detects as to whether or not the timer 36 has timed-out the predetermined time period, that is, the predetermined wait time period has been elapsed after the start time of the PLL circuit (step S8).

If it is detected in step S8 that timer 36 has not timed the predetermined wait time period, the control part 33 instructs the timer 36 to continue the time measuring operation (step S9), and the operation proceeds to step S7. If it is detected in step S8 that the timer 36 has already timed the predetermined wait time period, the control part 33 cancels the control operation in the working loop (step S10), and detection is made as to whether or not the value of the current number of attempts is less than the maximum number of attempts (step S11).

If it is detected, in step S11, that the current number is equal to or greater than the maximum number of attempts ($n \geq n_{MAX}$), the control part 33 judges that the lock-in of the PLL circuit 3 to the reference frequency $f_0$ has not been attained by setting the oscillation frequency of the VCO 320 for all of the output integration values (see FIG. 6) which the control part 33 can control. In this state, the control part 33 sets an abnormality flag, and performs an operation to provide an external output corresponding to this state (step S12). Thereafter, this frequency pull-in operation is terminated. Based on the abnormality flag of this case, an operation to deal with the state, such as to perform the frequency pull-in operation once more, is performed in a system control part which is not shown in the figure.

If, on the other hand, it is detected, in step S11, that the current number is smaller than the maximum number of attempts ($n < n_{MAX}$), the control part 33 controls the counter 35 to increase its count value by one (step S13), and the program goes to step S2.

In this way, by the frequency pull-in processes, the output integration value supplied to the control input terminal of the digital VCO 320 is set to be:

0.25

0.25+0.0005, 0.25−0.0005, 0.25+0.0005×2, 0.25−0.0005×2, . . .

0.25+0.0005×($n_{MAX}$−3)/2, 0.25−0.0005×($n_{MAX}$−3)/2, 0.25+0.0005×($n_{MAX}$−1)/2, and 0.25−0.0005×($n_{MAX}$−1)/2 as the number of attempts increases in the order of 1, 2, 3, 4, 5, . . . , $n_{MAX}$−2, $n_{MAX}$−1, $n_{MAX}$, as is understood from FIG. 6.

With this change of the output integration value, the initial oscillation frequency of the VCO 320 upon starting the operation of the PLL assumes:

5 MHz,

5 MHz+10 kHz,

5 MHz−10 kHz,

5 MHz+20 kHz,

5 MHz−20 kHz, . . . .

As described specifically, the digital VCO 320 alternates the increase and decrease of the oscillation frequency about the oscillation frequency of 5 MHz corresponding to the reset value of 0.25, during the period before the lock-in of the PLL. In this way, the oscillation frequency changes in such a way that the change width gradually increases through the change of oscillation frequency.

Figure 7:
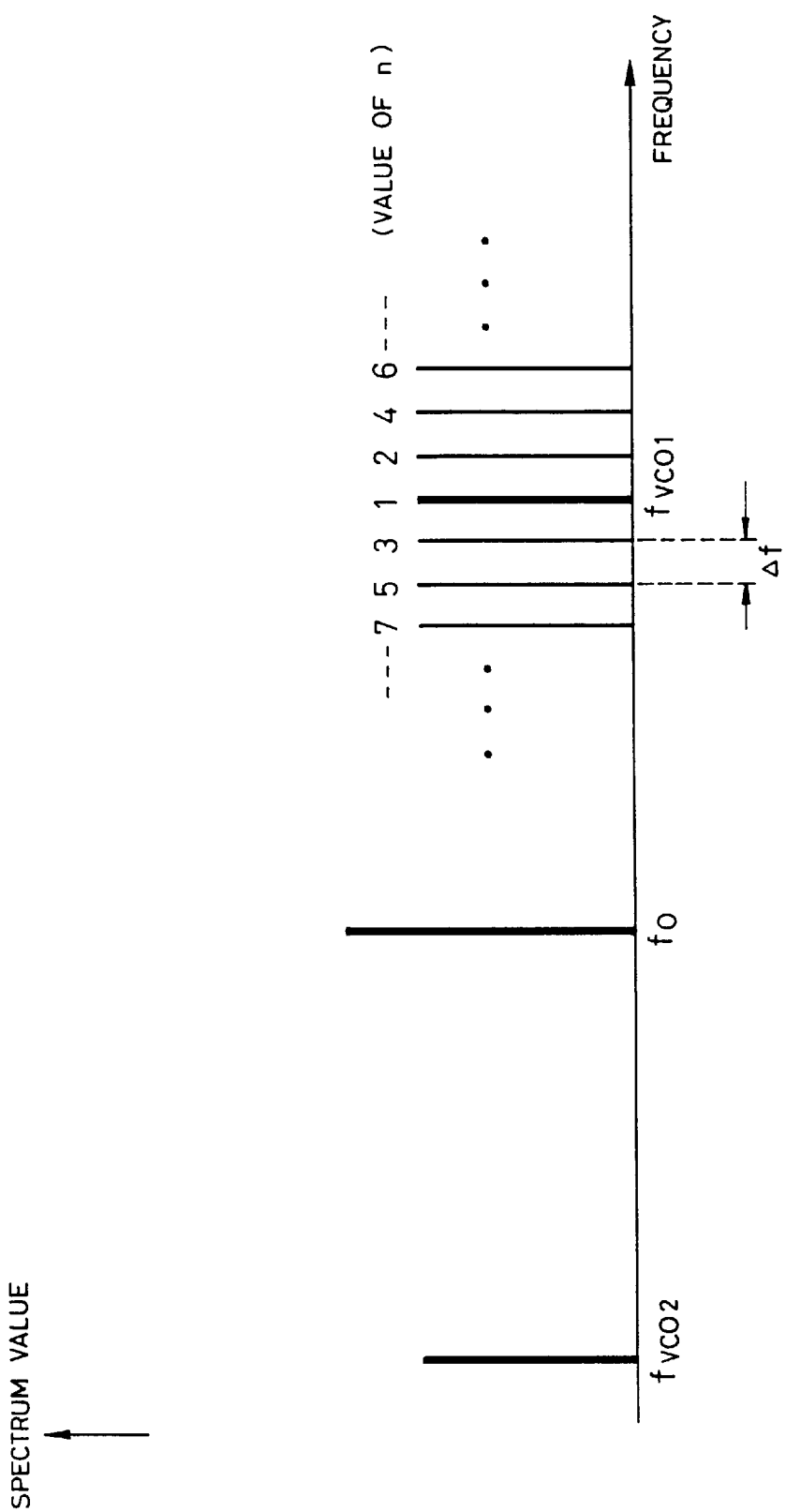
FIG. 7 is a spectrum diagram showing the operation and effects of the PLL circuit shown in FIG. 4.

This feature is will be further explained with reference to FIG. 7. At an initial stage, it is not known whether or not the initially set oscillation frequency of the VCO is high or low relative to the reference frequency $f_0$. Assume that the initially set oscillation frequency is at $f_{VCO1}$ as illustrated in this figure. In this case, if the control input value is given to the VCO in such a way that it gradually raises from $f_{VCO1}$, then the oscillation frequency of the VCO will not reach to the reference frequency $f_0$, and moreover it ultimately will not reach to the lock-in range. Conversely, if the initially set oscillation frequency of the VCO is at $f_{VCO2}$ as illustrated in the figure, a similar results will be caused if the control input value which gradually falls from $f_{VCO2}$ is given to the VCO.

In contradistinction with the conditions mentioned above, in the case of the embodiments of the present invention, the above-described inconveniences are avoided because, if the initially set oscillation frequency of the VCO is at $f_{VCO1}$ the control input value of the VCO is alternately increased and decreased about $f_{VCO1}$ as a center value as represented in the figure by vertical lines which are labeled by the n values. In this embodiment, when the reference frequency $f_0$ is within 5 MHz±100 kHz, the reference value for the system clock frequency of 20 MHz is set at 0.0005, and $\Delta f$, that is the unit width of the increase or decrease of the oscillation frequency of VCO, is set at 10 kHz. In this case, a number 21 is suited for the value of $n_{MAX}$ ($n_{MAX}$=21). In other words, by the attempts of 21 times, the initial frequency of the VCO can be controlled for a frequency range of a varying extent of 200 kHz (−100 kHz to +100 kHz) of the reference frequency.

Figure 8:
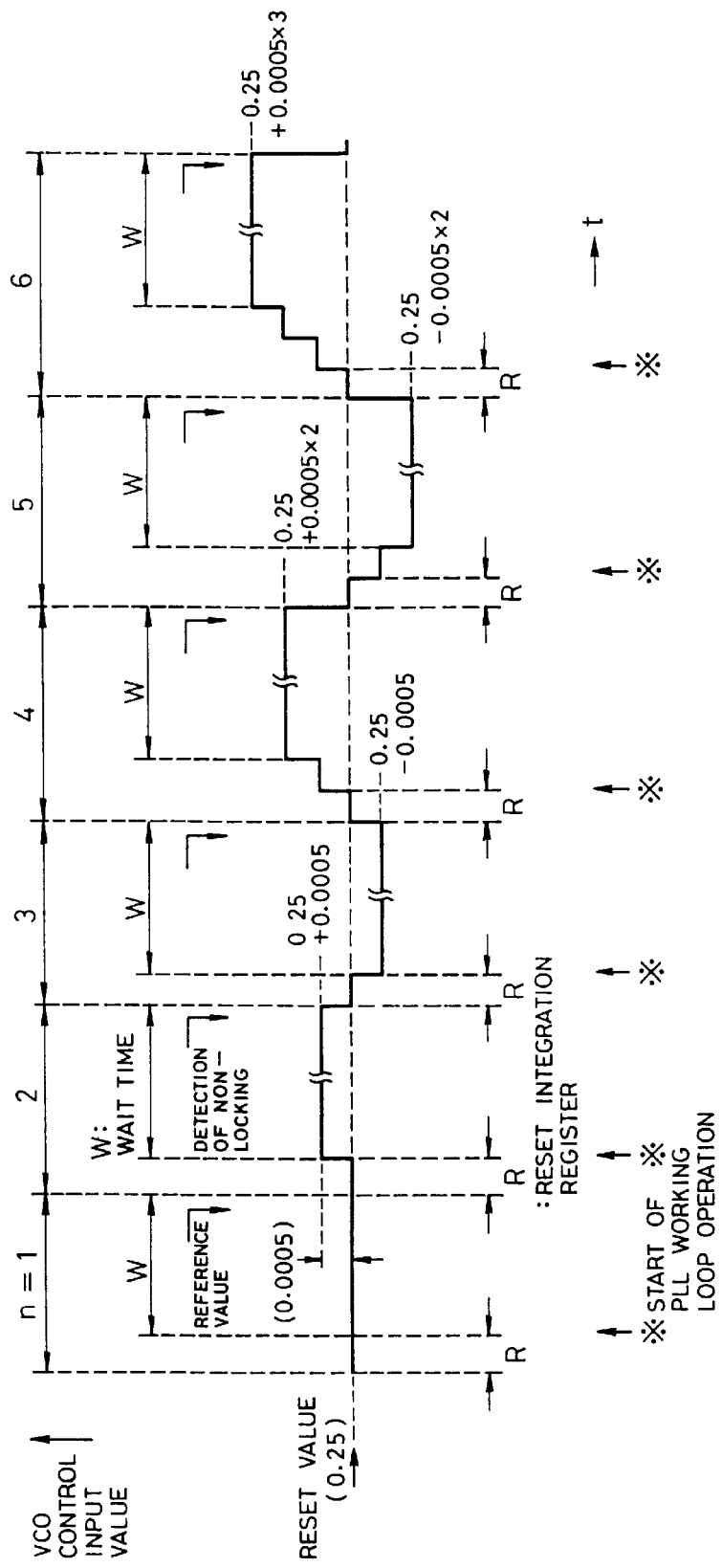
FIG. 8 is a waveform diagram showing the manner of variation of the control input value of the VCO in the frequency pull-in operation performed by the PLL circuit shown in FIG. 4.

FIG. 8 shows the manner of the variation of the control input value of the VCO in the frequency pull-in process in the embodiment of the present invention.

In FIG. 8, a case that the lock-in is not detected at all after the first pull-in attempting period, is depicted. Each of the attempting periods begins with a period R for resetting the integration register by the step S40, S4A, or S4B, and passes through a period in which integration is performed with the reference value and the number of integration defined by the step S3A or S3B, and reaches a waiting period W based on the timer 36 formed by the steps S6 through S9. Immediately before the end of the waiting period W, a final detection of locking is performed in the attempt at step S7.

Through this operation, the control input value of the VCO alternates increase and decrease from a control input value (reference control input value) which corresponds to the initial oscillation frequency of VCO corresponding to the reset value (0.25). Each time the number of attempts increases by two, the amount of change from the reference control input value is increased to a next integer multiple of the unit change width. In principle, the period of one attempt increases with the increase in number of attempts because of the increase of the number of integration operations. However, in practice, since the period (1/20 MHz) of the system clock in which the resetting of the integration register and the integration operation are performed is considerably short with respect to the wait time W, the attempts are made at intervals which can be regarded to be almost the same.

Figure 1:
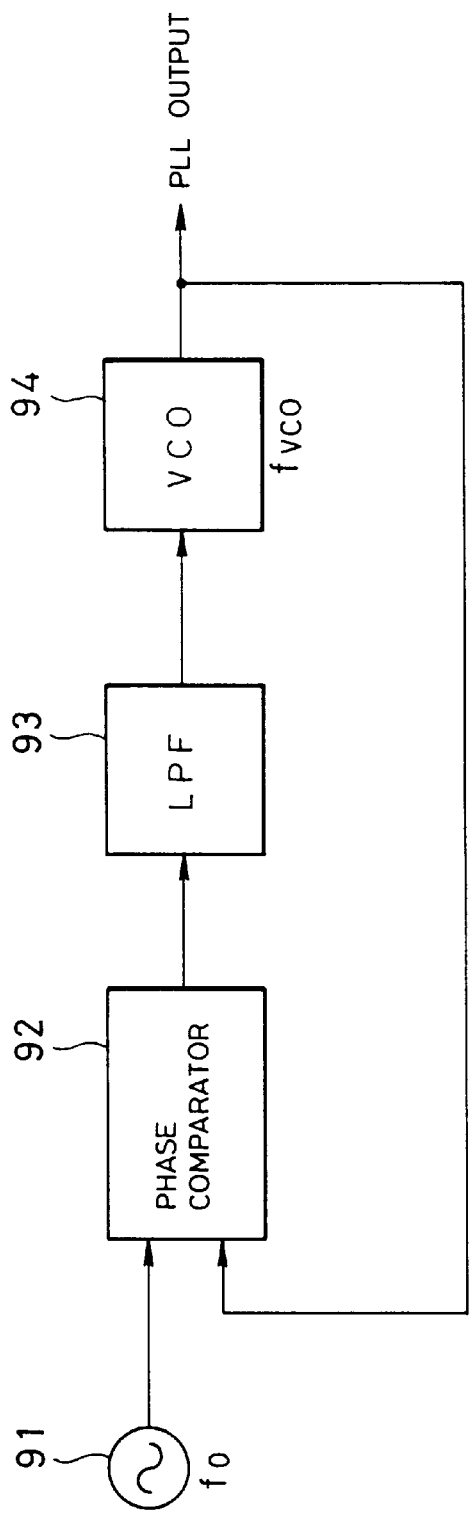
FIG. 1 is a block diagram showing the structure of a PLL circuit generally used in prior art.
Figure 2:
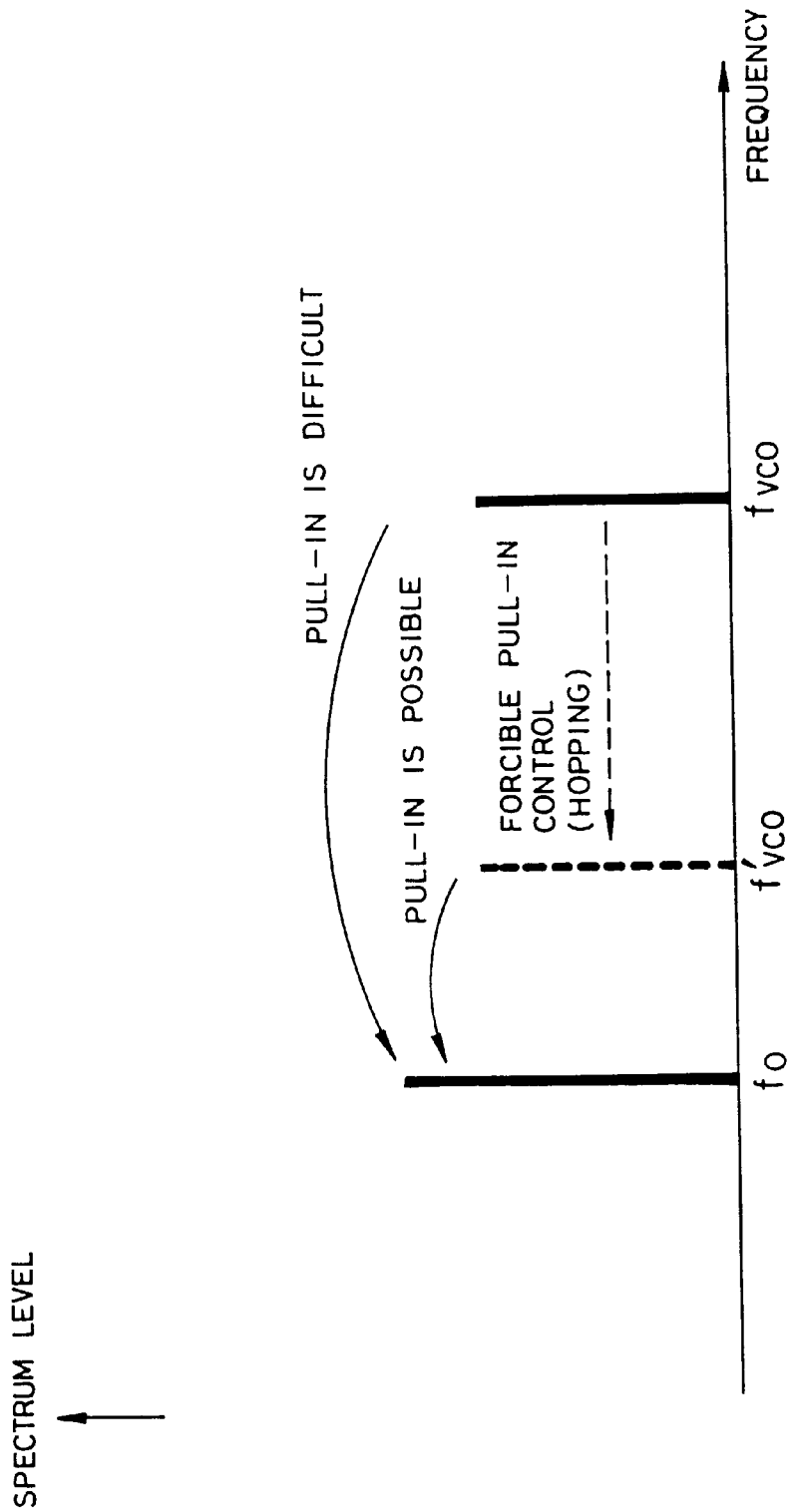
FIG. 2 is a spectrum diagram for explaining a problem associated with the PLL circuit shown in FIG. 1.
Figure 3:
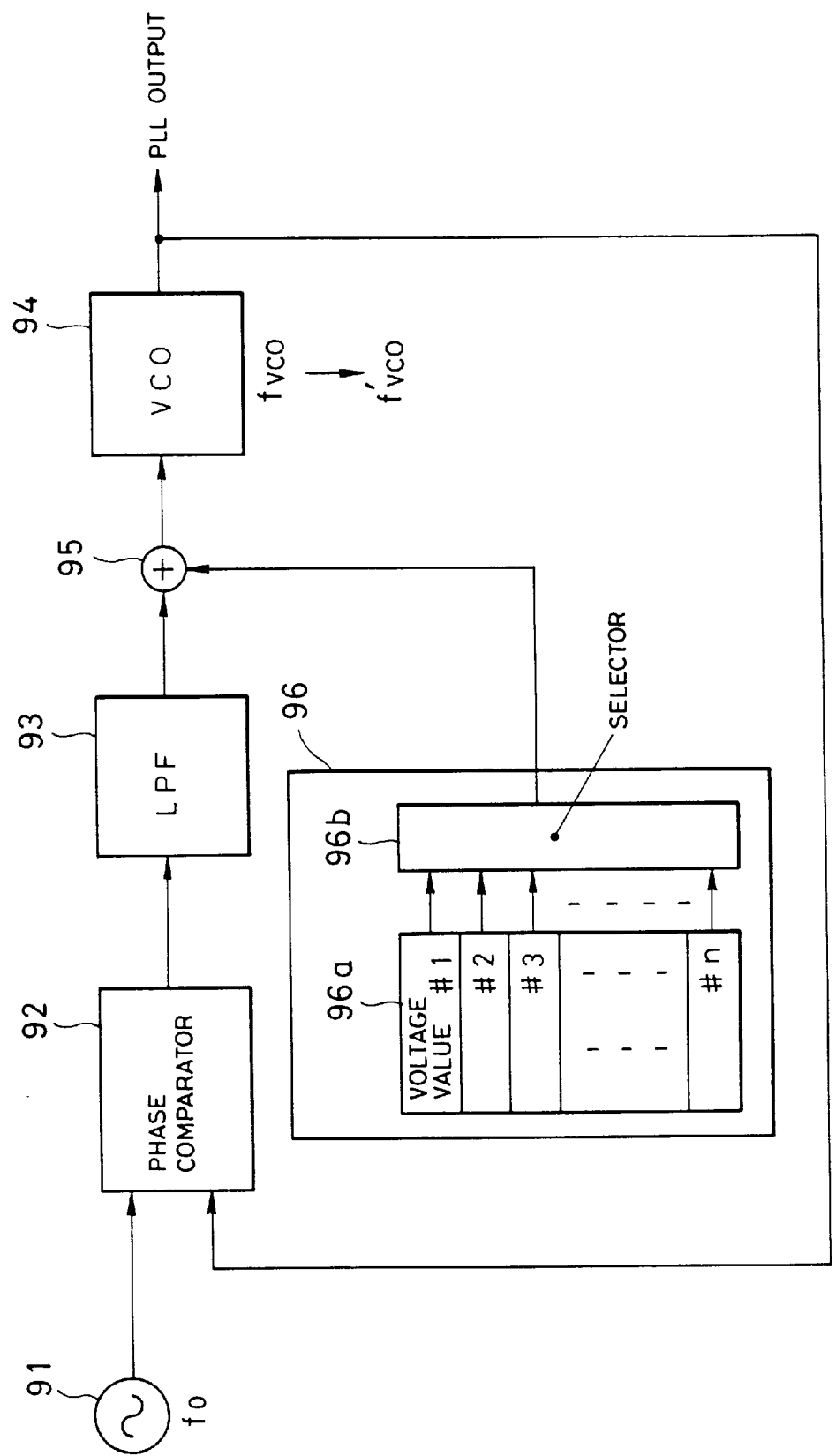
FIG. 3 is a block diagram of a conceivable PLL circuit to solve the problem of the PLL circuit of FIG. 1.

As will be understood from the foregoing explanation, by the improvement of the control of, e.g., the integration register 31R, generation of the control input value to the VCO by what is called "arithmetic operation", is realized in this embodiment. In other words, the frequency of the VCO is forcibly pulled into the reference frequency by generating a control input value by computation each time of the attempt, i.e., without the need of the bank memory 96a having a large capacity that is employed in the scheme of the PLL circuit depicted in FIG. 3. Furthermore, the number of the reference value to be supplied to the VCO is limited to one, so that the simplification of the circuit configuration is attained in that respect. Moreover, the reference value itself is made variable and arbitrarily adjusted or controlled from outside, so that a wide control range of the forcible pull-in of the VCO is assured. With these features, the operation of the PLL circuit flexibly complies with the reference frequency $f_0$.

Furthermore, by changing a set time of the timer 36, the wait time W explained above can be adjusted, and the setting can be performed from outside of the PLL circuit 3, as illustrated in FIG. 4. In addition, the value of $n_{MAX}$ also can be made adjustable. As shown in FIG. 4, the adjustment can be accomplished by supplying a signal representing the value of $n_{MAX}$ to be set to the control part 33 from outside of the PLL circuit 3, and by rendering the control part 33 to perform such a process as shown in FIG. 5.

On the other hand, the present invention also features that the D-LPF 31 is utilized as a forcible pull-in circuit which adds the value of the phase error signal and a forcible pull-in signal when the PLL circuit 3 is not in the locked state and supplies a signal responsive to a result of addition as a control signal of the VCO 320. In other words, the operation of the D-LPF 31 can be represented by an equivalent circuit shown in FIG. 9.

Figure 9:
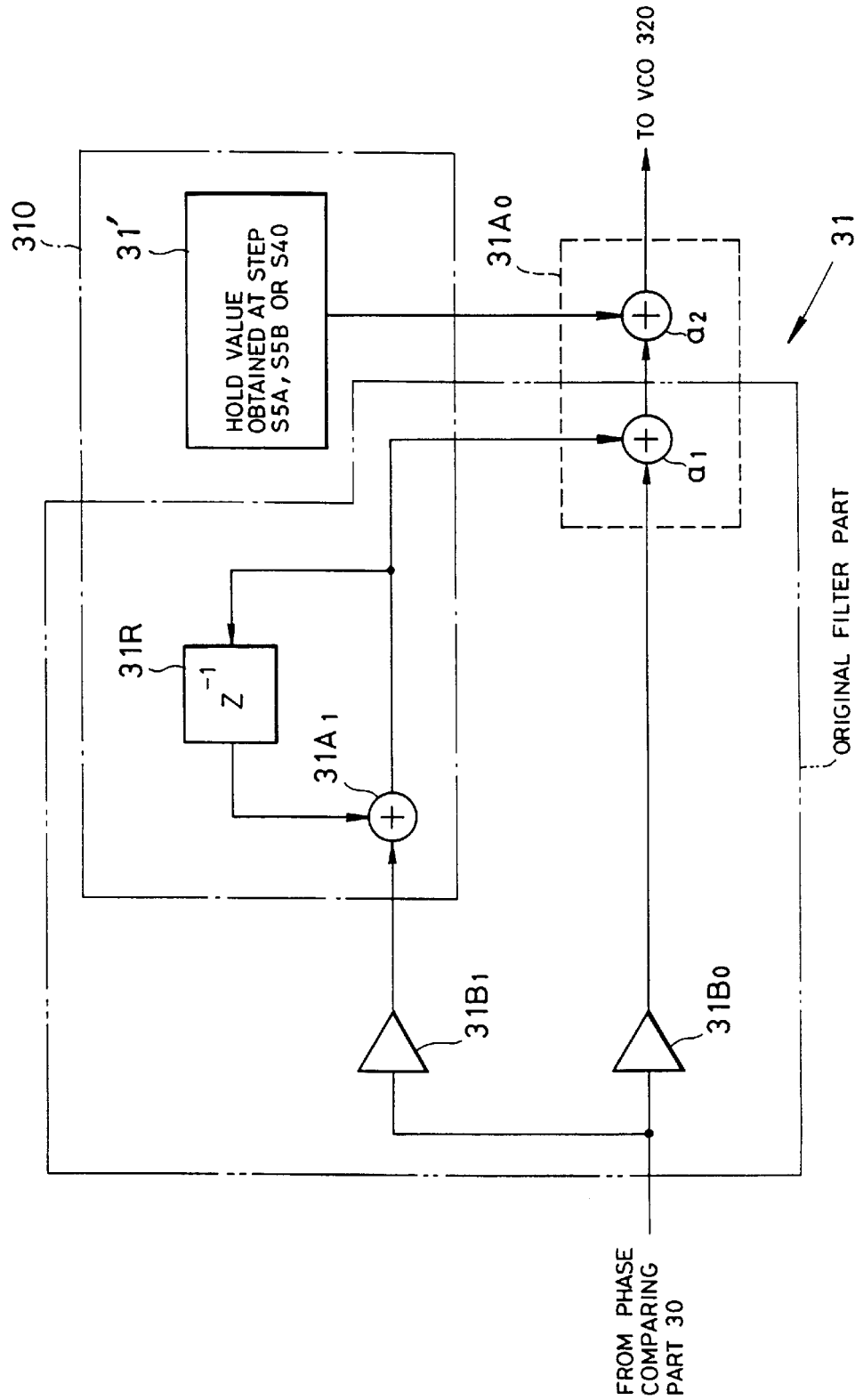
FIG. 9 is a block diagram showing an equivalent circuit of the D-LPF 31 in the PLL circuit shown in FIG. 4.

As shown in FIG. 9, the adder $31A_0$ can be replaced with two adders i.e. the adders of front and rear stages $a_1$ and $a_2$. The value held in the integration register 31R at step S5A, S5B, or S40 and the output value of the front adder $a_1$ are given to the rear adder $a_2$, and the output values of the coefficient multiplier $31B_0$ and the adder $31A_1$ are given to the front adder $a_1$. An integration section 310 is constituted by a block 31' which obtains the holding value of the integration register 31R through the process in step S5A, S5B or S40, the adder $31A_1$, and the integration register 31R. Unlike the integration register shown in FIG. 4, the integration register 31R starts its operation after its value has previously been set to zero. Thus, before working of the loop operation (PLL operation) the initial value of the integration operation is generated by the block 31' (function 1), and after the start of the PLL operation an operation to integrate the output value of the coefficient multiplier $31B_1$ is performed by the adder $31A_1$ and the integration register 31R using the initial value having been generated as a reference.

As explained above, the equivalent circuit shown in FIG. 9 realizes the two functions respectively by dedicated circuit blocks. It also corresponds to an exact realization of the principles of the operation of the embodiment of the invention. In other words, in the structure of the integration part 310 shown in FIG. 4, the function of the block 31' is realized only by the adder $31A_1$ and the integration register 31R by the use of the switch 31SW.

As explained specifically in the foregoing description, a PLL circuit having a simple structure and a wide usability is provided according to the present invention.

In the foregoing description, the explanation has been made for the case that the maximum number of attempts $n_{MAX}$ is an odd number. It is, however, apparent that the present invention is also applicable to the case that the maximum number of attempts $n_{MAX}$ is an even number. Furthermore, although the loop filter 31 explained in the description is a complete integration type filter, filters of various types such as a lag filter, or a lag-read filter, can be employed basically. It is however desirable to use a complete integration type filter in view of its structure and characteristics in consideration of the fact that the signal is to be processed is in digital form.

Although the explanation of a particular embodiment has been made in the foregoing description, it is needless to mention that various changes and modifications occur to those skilled in the art within a range that its designing is possible.

What is claimed is:

1. A phase locked loop (PLL) circuit comprising:
   an oscillator that oscillates at a frequency corresponding to a control input signal;
   a phase comparator that detects a phase difference between an oscillation signal of said oscillator and an input frequency signal and produces an error signal; and
   a forcible pull-in circuit that adds said error signal and a forcible pull-in signal to obtain said control input signal during an attempt period of a pull-in operation, wherein said forcible pull-in circuit comprises:
      a reference value generator that supplies a reference value determining a frequency step of the oscillation signal of said oscillator, and
      a computing circuit that computes a magnitude for said forcible pull-in signal based on said reference value,
   wherein said computing circuit sets said magnitude for said forcible pull-in signal at an integer multiple of said reference value, and increases said magnitude for said forcible pull-in signal stepwise while changing a polarity of said forcible pull-in signal from one of positive and negative polarities to the other polarity every attempt period of a pull-in operation.

2. A phase locked loop (PLL) circuit comprising:
   an oscillator that oscillates at a frequency corresponding to a control input signal;
   a phase comparator that detects a phase difference between an oscillation signal of said oscillator and an input frequency signal and produces an error signal; and
   a forcible pull-in circuit that adds said error signal and a forcible pull-in signal to obtain said control input signal during an attempt period of a pull-in operation, wherein said forcible pull-in circuit comprises:
   a reference value generator that supplies a reference value determining a frequency step of the oscillation signal of said oscillator, and
   a computing circuit that computes a magnitude for said forcible pull-in signal based on said reference value,
   wherein said computing circuit sets said magnitude for said forcible pull-in signal at an integer multiple of said reference value, and increases said magnitude for said forcible pull-in signal stepwise while changing a polarity of said forcible pull-in signal from one of positive and negative polarities to the other polarity every attempt period of the pull-in operation, and
   wherein said forcible pull-in circuit includes a loop filter comprising:
   an integration circuit to which said error signal is supplied when said PLL circuit is in a loop operation mode, and
   a main summing circuit for adding an integration output value of said integration circuit and said error signal, and
   wherein before a start of said loop operation mode said computing circuit sets said reference value instead of said error signal as a value to be integrated, and computes the magnitude for said forcible pull-in signal according to the integration output value obtained by integrating said reference value a predetermined number of times.

3. A PLL circuit as claimed in claim 2, wherein said integration circuit comprises:
   a register that holds an input value in response to a clock signal of a predetermined frequency;

a switching circuit that selects either a hold value of said register or a first reset value; and an auxiliary summing circuit that adds a value selected by said switching circuit to a value supplied to said integration circuit to obtain said integration output value, said integration output value being input to the register, wherein said reference value generator generates positive and negative values for said reference value, and wherein said computing circuit comprises:

a selector that selects one of: said error signal, said positive value of said reference value, said negative value of said reference value, or a second reset value; and a control circuit that controls, upon an n-th (n being a natural number) attempt period of the pull-in operation, for an effective generation period of one clock of said clock signal, said switching circuit to select said first reset value and said selector to select said second reset value thereby to reset said register, and subsequently controls, for an effective generation period of one clock of said clock signal at a number of times of integrations, which is determined based on a value of n, said selector to select one of said positive and negative values of said reference value when said value of n is an even number, and to select the other of said positive and negative values of said reference value when said value of n is an odd number, to produce said integration output value.

4. A PLL circuit as claimed in claim 3, wherein said control circuit:

controls, after a generation of said integration output value, said selector to select said error signal, and said switching circuit to select said hold value of said register, to perform a phase synchronization operation of the loop operation mode, and increases said value of n and performs control operations of said control circuit once again if a lock-in state is not obtained after a lapse of a predetermined time period after starting of said phase synchronization operation of said loop operation mode.

5. A PLL circuit as claimed in claim 4, wherein said predetermined time period is variable.

6. A PLL circuit as claimed in claim 4, wherein said control circuit judges that the lock-in state cannot be obtained if said value of n, after being increased, exceeds a predetermined maximum value.

7. A PLL circuit as claimed in claim 5, wherein said control circuit judges that the lock-in state cannot be obtained if said value of n, after being increased, exceeds a predetermined maximum value.

8. A PLL circuit as claimed in claim 6, wherein said predetermined maximum value is variable.

9. A PLL circuit as claimed in claim 7, wherein said predetermined maximum value is variable.

10. A PLL circuit as claimed in claim 3, wherein said number of times of integration is (n−1)/2 when n is an odd number and is n/2 when said n is an even number.

11. A PLL circuit as claimed in claim 4, wherein said number of times of integration is (n−1)/2 when n is an odd number and is n/2 when said n is an even number.

12. A PLL circuit as claimed in claim 5, wherein said number of times of integration is (n−1)/2 when n is an odd number and is n/2 when said n is an even number.

13. A PLL circuit as claimed in claim 6, wherein said number of times of integration is (n−1)/2 when n is an odd number and is n/2 when said n is an even number.

14. A PLL circuit as claimed in claim 7, wherein said number of times of integration is (n−1)/2 when n is an odd number and is n/2 when said n is an even number.

15. A PLL circuit as claimed in claim 8, wherein said number of times of integration is (n−1)/2 when n is an odd number and is n/2 when said n is an even number.

16. A PLL circuit as claimed in claim 9, wherein said number of times of integration is (n−1)/2 when n is an odd number and is n/2 when said n is an even number.

17. A PLL circuit as claimed in claim 1, wherein said reference value is variable.

18. A PLL circuit as claimed in claim 2, wherein said reference value is variable.

19. A PLL circuit as claimed in claim 3, wherein said reference value is variable.

20. A PLL circuit as claimed in claim 1, wherein at least a circuit part of said PLL circuit is implemented as a digital signal processing integrated circuit.

21. A PLL circuit as claimed in claim 2, wherein at least a circuit part of said PLL circuit is implemented as a digital signal processing integrated circuit.

22. A PLL circuit as claimed in claim 3, wherein at least a circuit part of said PLL circuit is implemented as a digital signal processing integrated circuit.

23. A frequency pull-in method for use in a phase locked loop (PLL) circuit having an oscillator that oscillates at a frequency corresponding to a control input signal, and a phase comparator that detects a phase difference between an oscillation output signal of said oscillator and an input frequency signal and outputs an error signal, said method comprising:

generating a reference value for determining a frequency step of an oscillation frequency of said oscillator;

generating a forcible pull-in signal based on said reference value during an attempt period; and adding said error signal and said forcible pull-in signal to produce said control input signal, wherein generating the forcible pull-in signal includes, setting a magnitude of said forcible pull-in signal at an integer multiple of said reference value; and increasing the magnitude of said forcible pull-in signal stepwise while changing a polarity of said forcible pull-in signal from one of positive and negative polarities to the other polarity every attempt period.

* * * * *